United States Patent
Maier et al.

(10) Patent No.: US 10,819,107 B2
(45) Date of Patent: Oct. 27, 2020

(54) ELECTRONIC UNIT COMPRISING AN ESD PROTECTIVE ARRANGEMENT

(71) Applicant: ZF Friedrichshafen AG, Friedrichshafen (DE)

(72) Inventors: Thomas Maier, Nuenburg v. Wald (DE); Mike Vogel, Regensburg (DE); Josef Loibl, Bad Abbach (DE)

(73) Assignee: ZF Freidrichshafen AG, Friedrichshafen (DE)

( * ) Notice: Subject to any disclaimer, the term of this patent is extended or adjusted under 35 U.S.C. 154(b) by 265 days.

(21) Appl. No.: 15/483,111

(22) Filed: Apr. 10, 2017

(65) Prior Publication Data

US 2017/0294776 A1    Oct. 12, 2017

(30) Foreign Application Priority Data

Apr. 11, 2016 (DE) .................. 10 2016 205 966

(51) Int. Cl.
| | |
|---|---|
| *H05K 1/00* | (2006.01) |
| *H02H 9/04* | (2006.01) |
| *H05K 7/20* | (2006.01) |
| *H05K 1/18* | (2006.01) |
| *H05K 5/00* | (2006.01) |

(52) U.S. Cl.
CPC .............. *H02H 9/045* (2013.01); *H05K 1/18* (2013.01); *H05K 5/0082* (2013.01); *H05K 7/20854* (2013.01)

(58) Field of Classification Search
CPC ......... H02H 9/045; H05K 1/18; H05K 5/0082
See application file for complete search history.

(56) References Cited

U.S. PATENT DOCUMENTS

| | | | | | |
|---|---|---|---|---|---|
| 6,274,821 | B1 * | 8/2001 | Echigo | ................. | H05K 1/0271 174/255 |
| 6,534,859 | B1 * | 3/2003 | Shim | ................... | H01L 23/3128 257/675 |
| 6,798,049 | B1 * | 9/2004 | Shin | ........................ | H01L 23/13 257/676 |
| 7,185,426 | B1 * | 3/2007 | Hiner | .................. | H01L 21/4857 257/687 |
| 7,656,674 | B2 * | 2/2010 | Wetzel | ................ | F16H 61/0006 361/752 |
| 8,300,423 | B1 * | 10/2012 | Darveaux | ............. | H01L 25/105 361/761 |
| 8,488,324 | B2 * | 7/2013 | Becker | ................. | H05K 5/0082 165/80.2 |
| 8,633,403 | B2 * | 1/2014 | Lin | ...................... | H05K 1/0218 174/386 |

(Continued)

FOREIGN PATENT DOCUMENTS

DE    10 2013 212 265 A1    12/2014
DE    10 2013 215 368 A1    2/2015

*Primary Examiner* — Pete T Lee
(74) *Attorney, Agent, or Firm* — Brinks Gilson & Lione

(57) ABSTRACT

The disclosure relates to an electronic unit with a circuit board having at least one component arranged on a main surface of the circuit board and a casing element, which incorporates the at least one component, as well as with an ESD protection arrangement for the circuit board. According to the disclosure, open areas on the circuit board, which are not covered by the casing element, are covered with a gold layer directly mounted on a copper surface of the circuit board.

18 Claims, 2 Drawing Sheets

(56) References Cited

U.S. PATENT DOCUMENTS

2001/0011766 A1*  8/2001  Nishizawa ............. G06K 19/07
                                                            257/685
2009/0296361 A1*  12/2009 Huang .................. H01L 23/552
                                                            361/783
2010/0020518 A1*  1/2010  Bustamante ...... H01L 23/49805
                                                            361/818
2013/0147037 A1*  6/2013  Shen ................ H01L 23/49811
                                                            257/737

* cited by examiner

ELECTRONIC UNIT COMPRISING AN ESD PROTECTIVE ARRANGEMENT

PRIORITY STATEMENT

This application claims the benefit of German Patent Application DE 10 2016 205 966.1, filed Apr. 11, 2016, and incorporates the German Patent Application by reference herein in its entirety.

FIELD

The present disclosure relates to an electronic unit with circuit board.

BACKGROUND

In current applications for mechatronic control units, encapsulated electronic components (for example, a metal housing with glass feedthroughs) and a distribution of signals and currents via lead frames, strands or flexible circuit boards are used. Electronic control units are constantly subject to the tendency of becoming increasingly cheaper despite the fact that the range of functions stays consistent or increases. This requires a further development of existing solutions or the use of novel concepts. At the same time, it is necessary that the mechatronic control units fulfill the required electrostatic discharge ("ESD") regulations.

DE 10 2013 212 265 A1 and DE 10 2013 215 368 A1 disclose generic electronic units with circuit boards, which comprise an enclosure for components arranged on the circuit board.

This disclosure has the objective of providing an electronic unit with an effective ESD protection.

SUMMARY

The disclosure is based on an electronic unit with a circuit board having at least one component arranged on a main surface of the circuit board and a casing element, which incorporates the at least one component.

According to a first version of the disclosure, the electronic unit comprises an ESD protection arrangement for the circuit board. The ESD protection arrangement is designed in such a way that open areas on the circuit board, which are not covered by the casing element, are covered with a gold layer directly mounted on a copper surface of the circuit board.

According to a second version of the disclosure, the electronic unit comprises an ESD protection arrangement for the circuit board, wherein the ESD protection arrangement is designed in such a way that open areas on the circuit board, which are not covered by the casing element, are covered with a conductive covering arranged on the casing element. Advantageously, the conductive cover is a form-bending part, which is attached on the casing element and mounted on the circuit board at the marginal region of the circuit board. This ensures that the open areas on the circuit board located under the conductive cover are adequately protected against ESD bombardment and the ESD regulations are fulfilled.

Open areas on the circuit board, i.e., areas on the circuit board, which are not covered by the casing element, usually have the purpose of appropriately supporting the circuit board during the coating process to prevent the circuit board from bending during the coating process. Such open areas can expose sections of the copper surface of the circuit board.

The disclosure ensures that after the coating process these areas withstand an ESD bombardment of up to 15 kV without damaging the circuit board inner layers. This can reduce or prevent equipment failure.

According to the first version of the disclosure, the gold layer on the copper surface of the circuit board is applied in the areas of the circuit board where the copper surface of the circuit board is not covered by the casing element. A copper surface involves a copper layer on the surface of the circuit board, wherein such a copper layer can comprise, for example, a copper layer or copper track, which ensures the electrical functions of the circuit board.

In vehicle transmissions, the use of copper layers is usually objectionable, because copper forms undesirable reactions with the transmission oil, corroding the copper. The gold layer, which completely covers the copper layer, protects the copper layer or copper track from the transmission oil and thus prevents a deterioration or dissolution of the copper layer.

Advantageously, an overlap is available, i.e., the dimensions of the gold layer are larger than the dimensions of the open area of the circuit board formed by the recess in the casing element. This ensures that high ESD shielding is guaranteed even in the marginal region of the open areas.

In the present mechatronic concept, a control unit with a central circuit board is proposed. To this end, all components required in the electronic unit are arranged on a single circuit board. A single circuit board indicates that all electronic components, cooling elements, sensors and connecting elements for external devices are arranged on a single circuit board. In particular, this circuit board is formed in one piece and can also be designed in the form of a multilayer circuit board.

The proposed electronic unit with a circuit board is supplied with at least one component arranged on a main surface of the circuit board and with a casing element, which incorporates the at least one component, wherein the electronic unit comprises a single circuit board and at least sections of the casing element are located on a first main surface and a second main surface of the single circuit board such that the casing element has at least areas, which do not cover the circuit board, thus forming free surfaces on the circuit board surface.

Advantageously, the circuit board comprises at least one electronic component on one of the two main surfaces. Such an embodiment has the advantage of a further degree of freedom, especially for a double-sided assembly of the circuit board, thus increasing the flexibility when producing the electronic unit.

The free surfaces on the circuit board result in high stability between the upper side and lower side during the process of coating the circuit boards. As a result, the surfaces coated on the upper side and lower side can have different shapes and dimensions.

Advantageously, the electronic component is sealed by the casing element against fluids from the surrounding area and the heat dissipation element is at least partially enclosed by the casing element.

Advantageously, the enclosure of electronic components makes it possible to form sensors on the circuit board. As a result, sensors, which are usually mounted on the circuit board as individual components, can be directly injection molded on the circuit board. This can save material costs and assembling times.

Advantageously, the casing element fills an area between an external surface and a main surface area of the circuit board and/or the component and a main surface area of the circuit board. Advantageously, the casing element is formed by a casting compound or an injection molded material. Filling all hollow spaces between the circuit board and a component also increases the stability of the electronic unit. The external surface comprises the surface, which is formed by the injection molded material after performing the injection molding process.

In a further embodiment of the disclosure, the heat dissipation element has undercuts, which are surrounded by the casing element.

BRIEF DESCRIPTION OF THE DRAWINGS

The disclosure shall be explained in greater detail below based on the figures. In the figures, it is shown.

DETAILED DESCRIPTION OF EXAMPLE EMBODIMENTS

Identical components, or components having at least the same function, are provided with identical reference symbols in the figures.

Figure 1:
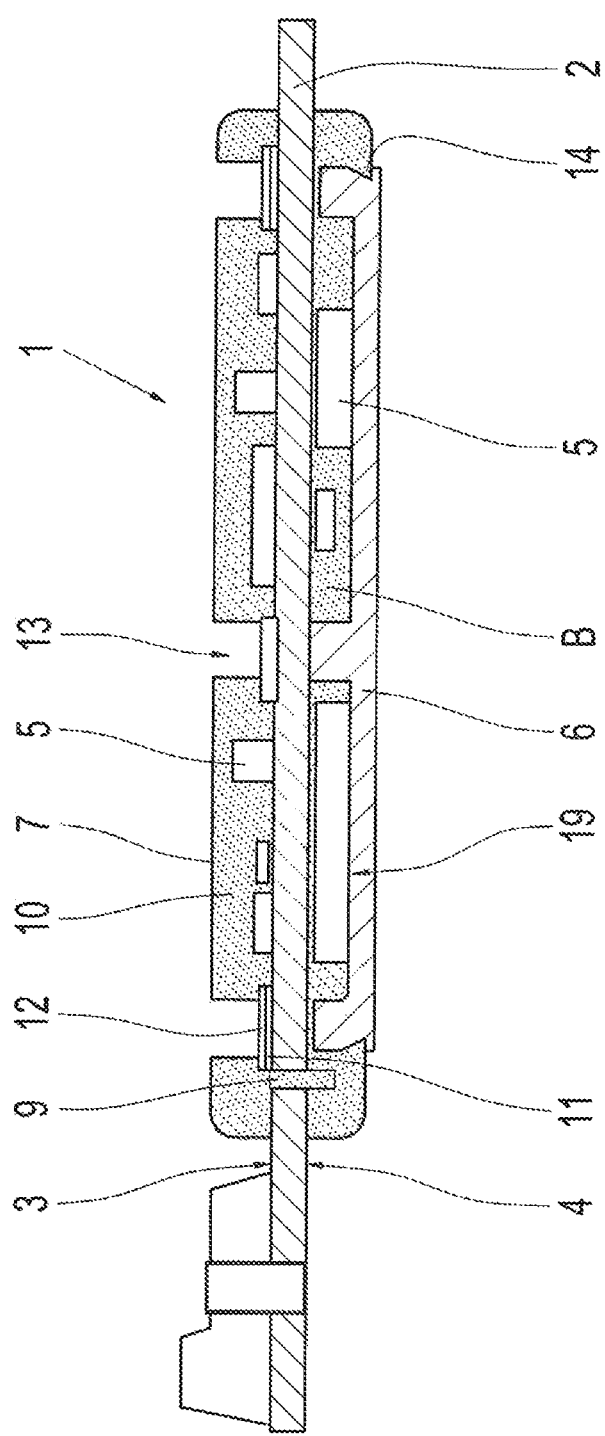
FIG. 1 is a sectional view of a diagram of a first version of an electronic unit.

FIG. 1 shows a diagram of the first version of an electronic unit. On the main surface 3,4 of a circuit board 2 a component 5, 6 and a casing element 7, which surrounds the component 5, 6, are arranged. Advantageously, an electronic component 5 is respectively arranged on both main surfaces 3, 4 of the circuit board 2, i.e., on the upper side 3 and the lower side 4 of the circuit board 2. Assembling the circuit board 2 on both sides has advantages regarding the packing density of the electronic unit.

The electronic unit 1 comprises a casing element 7, which surrounds the electronic components 5. Advantageously, the casing element 7 consists of a material (for example, thermosetting material), which fulfills predetermined protection arrangements, for example, resistance to water and/or oil, but also predetermined radiation characteristics. The casing element 7 is located on the upper side 3 and the lower side 4 of the circuit board 2. In this connection, the material 10 of the casing element 7 fills the perforations 9 in the circuit board 2, as well as the area between the electronic components 5 and the circuit board 2. Advantageously, the casing element 7 completely surrounds the circuit board 2. However, it is also possible that the casing element 7 covers only sections of the upper side 3 and lower side 4 of the circuit board 2. Because of the fact that the material 10 of the casing element 7 fills the perforations 9 in the circuit board 2, the casing element is formed in one piece. This results in a direct connection between the casing element section 7 on the lower side 4 and the casing element section 7 on the upper side 3, which increases the stability of the entire casing element 7 and thus also the circuit board 2.

The height of the electronic unit 1 can be defined by the thickness of the casing element 7. This also determines the external surface of the electronic unit 1.

The casing element 7 has open areas 13. These open areas 13 expose the upper side 3 or the lower side 4 of the circuit board 2, so that these areas 13 are not covered by the casing element 13. For example, in FIG. 1 such open areas 13 are provided on the upper side 3 of the circuit board 2. However, the open areas 13 can also be located on the lower side 4 or on the upper side 3 and the lower side 4.

In the open areas 13, a gold layer 12 is provided, which completely covers the copper layer 11 in the open areas 13 on the circuit board 2. The gold layer 12 in the open areas 13 is directly applied to the copper layer 11. The gold layer 12 extends into the casing element 7. As a result, the casing element 13 covers at least the marginal or edge region of the gold layer 12. This ensures that the copper layer 11 in the open areas 13 is shielded from the surrounding area of the electronic unit 1 and the possibly present transmission oil (not shown).

Advantageously, the aerial extension of the gold layer 12 in the open areas corresponds to the aerial extension of the copper layer 11 such that the gold layer 12 completely covers the copper layer 11 on the upper side 3 of the circuit board 2 in the open areas, without the gold layer 12 covering the upper side 3 of the circuit board 2. However, it is also possible that the aerial extension of the gold layer 12 is larger than the aerial extension of the copper layer 11, so that the gold layer 12 in the open area 13 is arranged, on the one hand, directly on the copper layer 11 and, on the other hand, directly on the upper side 3 of the circuit board 2. In both cases, the marginal or edge region of the gold layer 12 protrudes into the casing element 13.

In the circuit board 2, perforations 9 are made, which lead from the upper side 3 to the lower side 4 of the circuit board 2. Advantageously, these perforations 9 are made in the area around the individual electronic components 5. However, they can also be made in the marginal or edge region of the circuit board 2. Advantageously, the perforations 9 are evenly distributed in the circuit board 2, especially corresponding to a honeycomb structure. However, it is also possible that a larger or smaller number of perforations 9 are made around specific electronic components 5. Advantageously, the perforations 9 can be made in accordance with a predefined pattern. In particular, the perforations 9 are made in the form of drill holes. However, it is also possible that the perforations 9 are made in the form of straight or curved grooves.

Further connection areas (not shown) for plugs (not shown) or sensors (not shown) are provided on the circuit board 2.

On the lower side 4 of the circuit board 2, a heat dissipation element 6, for example, a cooling element, is arranged. This cooling element 6 is also at least partially surrounded by the casing element 7. A section of the cooling element 6 has no enclosure of the casing element 7. As a result, the heat can be freely discharged. However, it is also possible that the cooling element 6 is completely surrounded by the casing element 7. The area B between the circuit board 2 and the cooling element 6 is also filled with the material 10 of the casing element 7.

The casing element 7 comprises undercuts 14, which are formed with the material 10 of the casing element 7 and which are therefore surrounded by the casing element 7. This further ensures the stability of the electronic unit 1. It also results in the fact that the cooling element 6 is held in a fixed position. At the same time, the upper surface of the cooling element 6 can be directly connected with an electronic component 5 or it can be connected via a thermal material 19.

Figure 2:
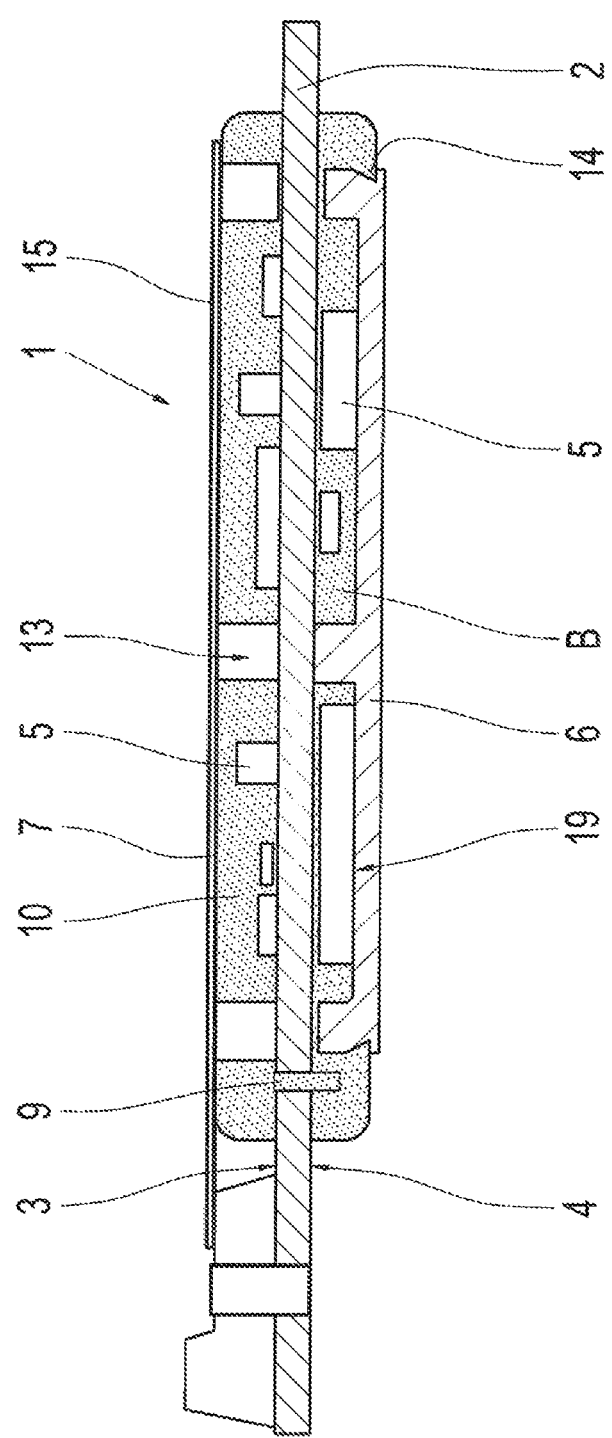
FIG. 2 is a sectional view of a diagram of a second version of an electronic unit.

FIG. 2 shows a diagram of a second version of an electronic unit. To avoid repetition, reference is made to the explanations made in FIG. 1. Identical reference numerals used in FIG. 2 and FIG. 1 have the same meaning.

The first version shown in FIG. 1 and the second version shown in FIG. 2 differ in that in FIG. 2 the copper layers 11 in the open areas 13 of the circuit board 2 are not covered with a gold layer 12, but instead with a conductive shielding element 15. The shielding element 15 is supported on the casing element 7 and completely covers the open areas 13 in that the shielding element 15 completely covers the open area 13 formed by the casing element 7 and protects it from the surrounding area.

The shielding element 15 is directly or indirectly mounted on the upper side 3 of the circuit board 2. The attachment can be performed by means of screw, solder, clamp or weld connections. An indirect attachment indicates that the shielding element 15 is mounted on one or multiple components, which are directly mounted on the circuit board 2.

REFERENCE NUMERALS

1 Electronic unit
2 Circuit board
3 Upper side
4 Lower side
5 Electronic component
6 Heat dissipation element
7 Casing element
8 Further casing element
9 Perforation
10 Injection molded material
11 Copper layer
12 Gold layer
13 Open areas on circuit board
14 Undercut
15 Conductive shielding element
19 Thermal material
B Area between circuit board and heat dissipation element

The invention claimed is:

1. An electronic unit comprising:
 a circuit board comprising:
  one or more copper surface support regions configured to support the circuit board during application of a casing material; and
  a perforation in the circuit board extending from an upper side of the circuit board to a lower side of the circuit board;
 a gold layer applied over the one or more copper surface support regions;
 at least one component arranged on a surface of the circuit board; and
 a casing element formed from the casing material that encloses the at least one component and is formed on the upper side of the circuit board and the lower side of the circuit board, wherein the casing element defines one or more open areas formed by a support used to support the circuit board during application of the casing material, wherein the open areas expose the gold layer applied over the one or more copper surface support regions that facilitates ESD protection of the circuit board, and wherein the casing element formed on the upper side of the circuit board is directly connected to the casing element formed on the lower side of the circuit board via the perforation in the circuit board.

2. The electronic unit according to claim 1, wherein the casing element covers at least an edge region of the gold layer.

3. The electronic unit according to claim 1, wherein the electronic unit is designed for an integrated transmission control system for motor vehicles.

4. The electronic unit according to claim 1, wherein a dimension of the gold layer is larger than a dimension of the open area that is covered with the gold layer.

5. The electronic unit according to claim 1, wherein the gold layer extends into the casing element adjacent to the open areas.

6. The electronic unit according to claim 1, wherein the gold layer directly contacts a non-copper portion of the circuit board.

7. The electronic unit according to claim 1, wherein the at least one component is sealed by the casing element against fluids.

8. The electronic unit according to claim 1, wherein the at least one component comprises a first component arranged on the upper surface of the circuit board and a second component arranged on the lower surface of the circuit board.

9. The electronic unit according to claim 1, wherein the circuit board further comprises:
 a heat dissipation element partially surrounded by the casing element and having at least one side exposed from the casing element.

10. An electronic unit comprising:
 a circuit board that includes one or more support regions configured to support the circuit board during application of a casing material;
 at least one component arranged on a surface of the circuit board;
 a casing element formed from the casing material that encloses the at least one component,
 wherein the casing element defines one or more open areas formed by a support used to support the circuit board during application of the casing material,
 a conductive covering directly contacting an upper surface of the casing element and covering the open areas, wherein the conductive covering facilitates ESD protection of the circuit board, and
 wherein the conductive cover is a form-bending part, which is attached on the casing element and mounted on the circuit board at an edge region of the circuit board.

11. The electronic unit according to claim 10, wherein the electronic unit is designed for an integrated transmission control system for motor vehicles.

12. The electronic unit according to claim 10, wherein the at least one component is sealed by the casing element against fluids.

13. The electronic unit according to claim 10, wherein the at least one component comprises a first component arranged on an upper surface of the circuit board and a second component arranged on a lower surface of the circuit board.

14. The electronic unit according to claim 10, further comprising a perforation in the circuit board extending from an upper side of the circuit board to a lower side of the circuit board, wherein the casing element on an upper side of the circuit board is directly connected to the casing element on a lower side of the circuit board via the perforation.

15. The electronic unit according to claim 10, wherein the at least one component is either a sensor or a heat dissipation element.

16. The electronic unit according to claim 1, wherein the ESD protection arrangement is configured to allow the at least one component to be operational after an electrostatic discharge of up to 15 kV.

17. The electronic unit according to claim 10, wherein the ESD protection arrangement is configured to allow the at least one component to be operational after an electrostatic discharge of up to 15 kV.

18. A method of manufacturing a circuit board, the method comprising:
   forming at least one copper surface on the circuit board at a support region of the circuit board to support the circuit board during application of a casing material onto the circuit board;
   disposing a gold layer over the at least one copper surface at least at the support region of the circuit board;
   supporting the circuit board with at least one support element contacting the support region of the circuit board;
   applying the casing material onto the circuit board to form a casing element enclosing at least one component of the circuit board and defining, by the support element, at least one open area within the casing element; and
   removing the support element from the casing element to expose the at least one open area within the casing element and to expose the gold layer.

* * * * *